United States Patent [19]

Itakura

[11] Patent Number: 5,252,957

[45] Date of Patent: Oct. 12, 1993

[54] SAMPLE-AND-HOLD CIRCUIT AND LIQUID CRYSTAL DISPLAY APPARATUS

[75] Inventor: Tetsuro Itakura, Fujisawa, Japan

[73] Assignee: Kabushiki Kaisha Toshiba, Kawasaki, Japan

[21] Appl. No.: 791,546

[22] Filed: Nov. 14, 1991

[30] Foreign Application Priority Data

Nov. 15, 1990 [JP] Japan .................. 2-307309

[51] Int. Cl.$^5$ .................. G09G 3/36; G11C 27/02
[52] U.S. Cl. .................. 345/98; 307/353; 345/208
[58] Field of Search .......... 340/784, 805, 811, 802, 340/793, 765; 307/353, 578; 358/153

[56] References Cited

U.S. PATENT DOCUMENTS

| | | | |
|---|---|---|---|
| 4,309,630 | 1/1982 | Young, Jr. .................. | 307/578 |
| 4,467,227 | 8/1984 | Lewyn et al. .................. | 577/307 |
| 4,492,979 | 1/1985 | Ikeda .................. | 358/153 |
| 4,781,437 | 11/1988 | Shields et al. .................. | 340/765 |
| 4,799,057 | 1/1989 | Takeda et al. .................. | 340/811 |
| 4,823,027 | 4/1989 | Takahashi .................. | 307/353 |
| 5,041,823 | 8/1991 | Johnson et al. .................. | 340/811 |
| 5,061,920 | 10/1991 | Nelson .................. | 340/811 |

OTHER PUBLICATIONS

Analog MOS Integrated Circuits for Signal Processing, Chap. 7, Sec. 7.1 "Nonideal Effects in the Switches", Gregorian, et al., 1986.

Primary Examiner—Ulysses Weldon
Assistant Examiner—Steve Saras
Attorney, Agent, or Firm—Oblon, Spivak, McClelland, Maier & Neustadt

[57] ABSTRACT

A sample-and-hold circuit device includes a plurality of sampling field effect transistors for sampling an input signal in response to sampling pulses sequentially supplied from a sampling pulse transferring section, a plurality of charge-holding capacitors for respectively holding signal charges sampled by the sampling field effect transistors, and a plurality of compensating field effect transistors each having source and drain electrodes connected to a corresponding one of the charge-holding capacitors to save excess charges accumulatively stored together with signal charges in the charge-holding capacitors, wherein there is provided a pulse applying circuit for applying a driving pulse, which is obtained by inverting a sampling pulse applied to the gate of the sampling field effect transistor of one of the succeeding-stage sample-and-hold circuits, to the gate of the compensating field effect transistor of each sample-and-hold circuit.

12 Claims, 9 Drawing Sheets

SAMPLE-AND-HOLD CIRCUIT AND LIQUID CRYSTAL DISPLAY APPARATUS

BACKGROUND OF THE INVENTION

1. Field of the Invention

This invention relates to a sample-and-hold circuit having a function of compensating for excess signal charge and a liquid crystal display apparatus constituting a driving circuit by use of the sample-and-hold circuits.

2. Description of the Related Art

A liquid crystal display apparatus includes a display unit having liquid crystal cells arranged in a matrix form and a plurality of signal lines supplied with image signals and intersected with a plurality of scanning lines, a display driving circuit for sampling and supplying image signals to the signal lines, and a scanning line selection circuit for selectively driving the scanning line. The display driving circuit is mainly constructed by a sample-and-hold circuit.

The display driving circuit of the conventional liquid crystal display apparatus includes sample-and-hold circuits of a number corresponding to the number of picture cells necessary for constituting one horizontal line and a shift register for supplying sampling pulses to the sample-and-hold circuits. Each sample-and-hold circuit includes a first MOS transistor serving as an analog switch for sampling a video signal and a holding capacitor for holding the sampled signal charge. The terminal voltage of the capacitor is derived from an output terminal connected to the signal line via an output buffer controlled by an output enable signal, and a second MOS transistor of charge compensation for releasing excess charges exceeding an amount of necessary signal charges which correspond to the video signal and which are included in the charges stored in the capacitor is connected between the capacitor and the output buffer. The excess charges may include channel charges stored in the channel when the first MOS transistor is set in the ON state and moved into the source or drain when it is turned off, or feed-through charges entering from the gate via the coupling capacitor. The drain and source of the second MOS transistor are connected to each other to make a capacitor and the gate thereof is controlled by a signal obtained by inverting a sampling pulse by means of an inverter.

For example, the sample-and-hold circuit having the above-described function of compensating the excess signal charge is analyzed in the article by Roubik Gregorian et al. in "Analog MOS Integrated Circuits for Signal Processing" pp 469 to 470.

Particularly, in a case where the conventional liquid crystal display driving circuit having the above-described excess signal charge compensating function is formed in an IC form, the output potential of each sample-and-hold circuit will vary by variation in the element characteristics, causing the image quality to be deteriorated.

That is, when a sampling pulse is supplied to the first MOS transistor and a sampling pulse inverted by an inverter is supplied to the second MOS transistor for compensation so as to sample an input signal, the time at which the second MOS transistor for compensation is turned on varies according to a variation in the delay time of the inverter. For example, if the second MOS transistor is turned on early, charges are directly supplied from the video signal line into the channel of the second MOS transistor because the first MOS transistor is still kept on. In contrast, if the second MOS transistor is turned on later than normal, part of the charges already stored in the charge-holding capacitor is supplied into the channel of the second MOS transistor. This means that the effect of the second MOS transistor for charge compensation, that is, the effect of removing the excess charges such as the channel storage charges of the first MOS transistor or feed-through charges from the gate will vary. As a result, the output potential will vary even when the input potential of each sample-and-hold circuit is kept unchanged.

As described above, in the conventional liquid crystal display driving circuit, particularly when it is formed in an IC form, the output potential varies according to a variation in the element characteristic of each sample-and-hold circuit, thereby deteriorating the quality of the displayed image.

SUMMARY OF THE INVENTION

An object of this invention is to provide a sample-and-hold circuit in which a switching transistor for sampling and a switching transistor for compensation can be correctly turned on and off.

Another object of this invention is to provide a high-quality liquid crystal display apparatus having a driving circuit constructed by use of a sample-and-hold circuit having a switching transistor for sampling and a switching transistor for compensation which are correctly turned on and off.

According to this invention, there is provided a sample-and-hold circuit device comprising a plurality of sampling field effect transistors for sampling an input signal in response to sampling pulses sequentially supplied from a sampling pulse transferring section; a plurality of charge-holding capacitors for respectively holding signal charges sampled by the sampling field effect transistors; and a plurality of compensating field effect transistors each having source and drain electrodes connected to a corresponding one of the charge-holding capacitors to save excess charges stored together with signal charges in the charge-holding capacitors, wherein there is provided a pulse applying circuit for applying a driving pulse, which is obtained by inverting a sampling pulse applied to the gate of the sampling field effect transistor of one of the succeeding-stage sample-and-hold circuits, to the gate of the compensating field effect transistor of each sample-and-hold circuit.

According to this invention, there is provided a liquid crystal display apparatus comprising a liquid crystal display unit having a plurality of picture elements, a plurality of signal lines for selectively supplying image signals to the picture elements and a plurality of scanning lines arranged to intersect the signal lines; a scanning line selection circuit for selectively driving the scanning lines; and a driving circuit including a plurality of sample-and-hold circuits arranged for the respective signal lines to sample and supply image signals to the signal lines and a sampling pulse transferring circuit for sequentially applying sampling pulses to the sample-and-hold circuits, wherein the sample-and-hold circuits of the driving circuit include a plurality of sampling field effect transistors for sampling an input image signal in response to the sampling pulses sequentially supplied from the sampling pulse transferring circuit, a plurality of charge-holding capacitors for respectively holding signal charges sampled by the first field effect transistors, a plurality of compensating field effect transistors each having source and drain electrodes connected to a corresponding one of the charge-holding circuits, for releasing excess charges stored together with the signal charges in the plurality of charge-holding capacitors, and a pulse applying circuit for applying a driving pulse to the gate of the compensating field effect transistor of each sample-and-hold circuit, the driving pulse being obtained by inverting a sampling pulse applied to the gate of the sampling field effect transistor of one of the succeeding-stage sample-and-hold circuits.

In the sample-and-hold circuit of this invention, the compensating field effect transistor for compensating the excess charges caused by feed-through charges from the gate or charges stored in the channel of the sampling field effect transistor is driven by a driving pulse obtained by inverting a sampling pulse which is applied to the gate of the sampling field effect transistor of one of the succeeding-stage sample-and-hold circuits. That is, the compensating field effect transistor is turned on after the sampling field effect transistor is completely turned off. As a result, even if the time at which the compensating field effect transistor is turned on or off has varied to some extent, the degree of excess charge compensating effect by the compensating field effect transistor will not be changed. That is, the degree of variation in the characteristic of the sample-and-hold circuit is reduced, thereby making it possible to provide a highly precise sample-and-hold circuit.

Further, when a liquid crystal display driving circuit is constructed by use of the above sample-and-hold circuit, a high-quality image can be displayed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
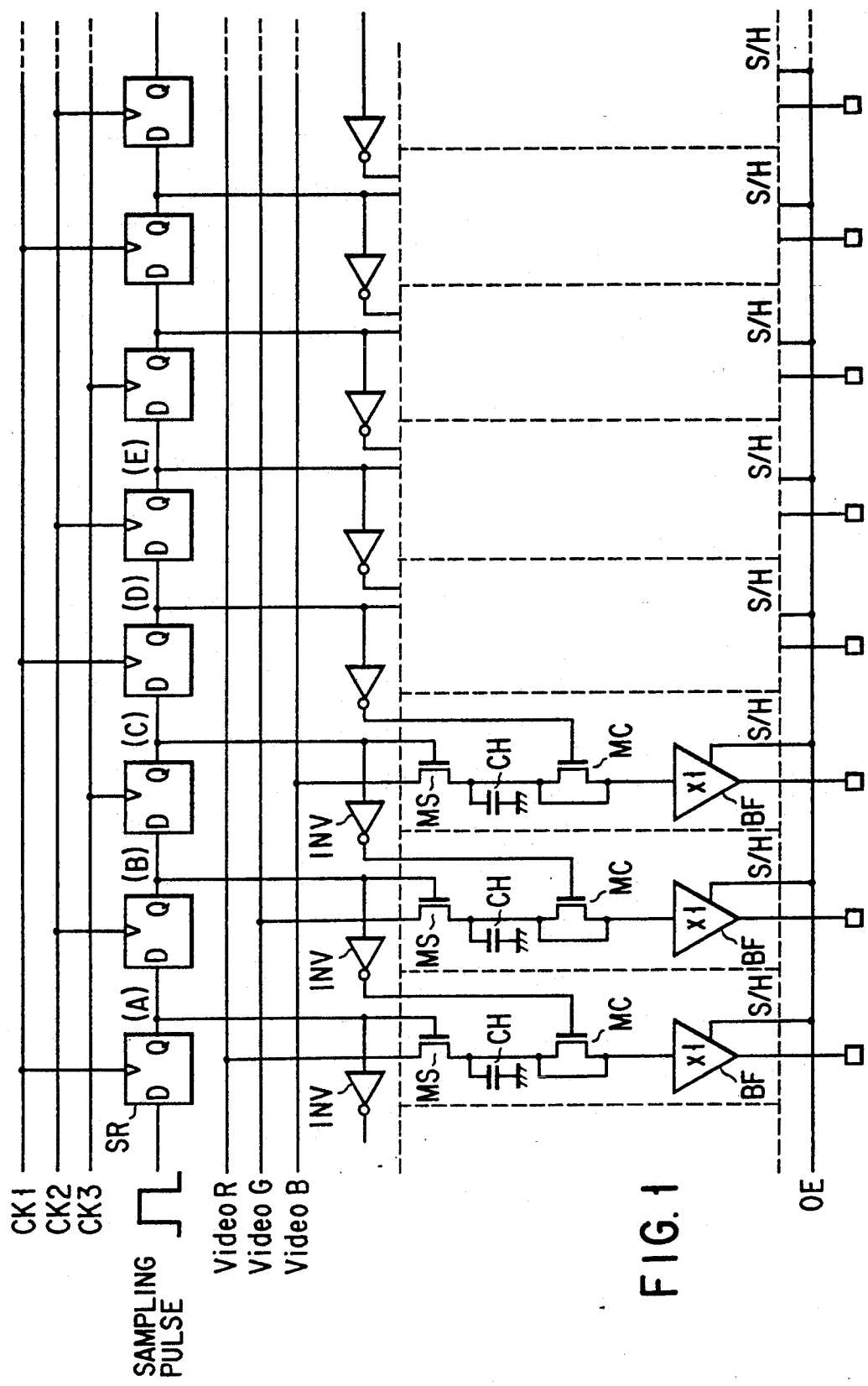
FIG. 1 is a circuit diagram of a liquid crystal display apparatus driving circuit according to one embodiment of this invention.
Figure 2:
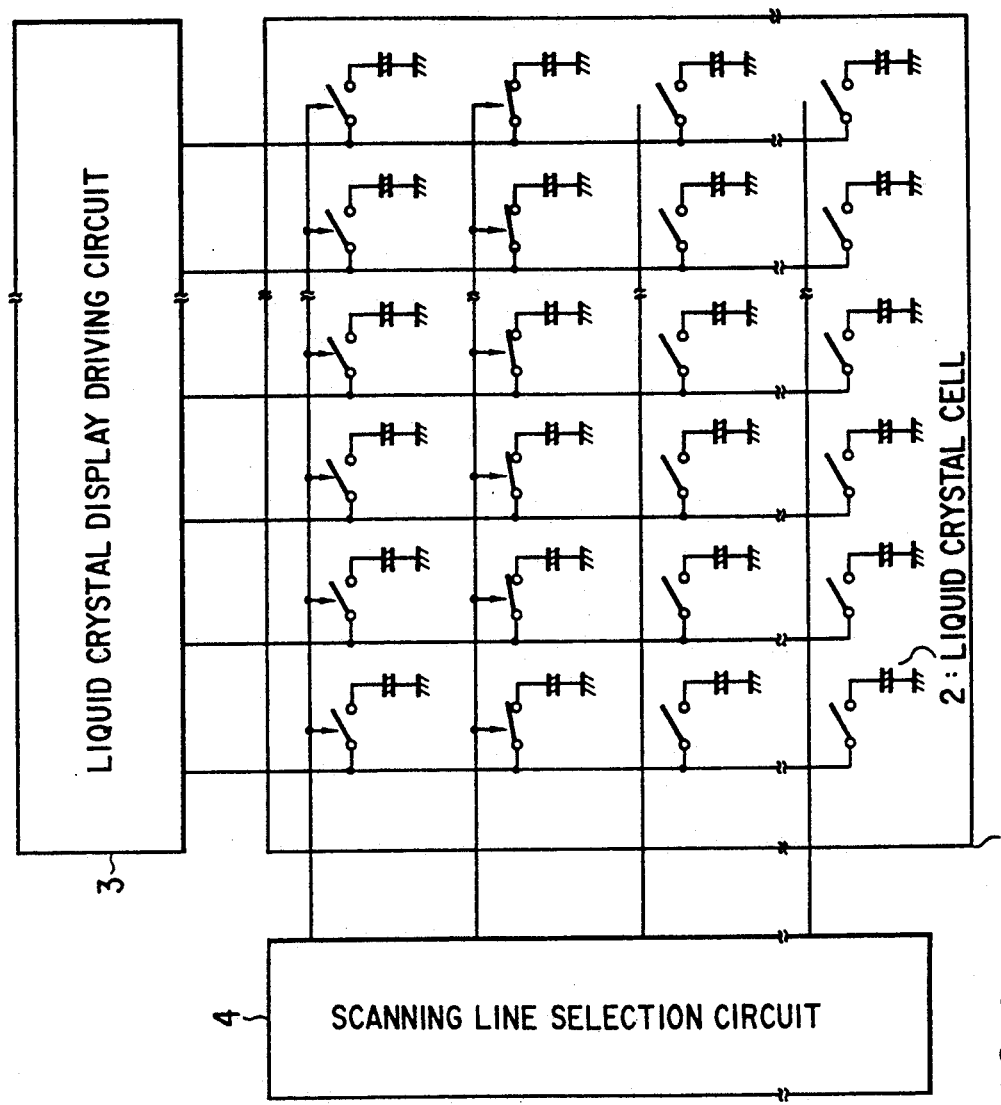
FIG. 2 is a diagram showing the whole construction of the liquid crystal display apparatus.

FIG. 1 shows a driving circuit for a liquid crystal display apparatus according to one embodiment of this invention constructed by use of sample-and-hold circuits of this invention and FIG. 2 shows the whole construction of the liquid crystal display apparatus using the above driving circuit.

As shown in FIG. 2, the liquid crystal display apparatus is constructed by a display unit 1 of, for example, an active matrix type having liquid crystal cells 2 arranged in a matrix form, a plurality of signal lines and a plurality of scanning lines arranged to intersect the signal lines, a display driving circuit 3 for supplying a sampled video signal to the signal lines, and a scanning line selection circuit 4 for sequentially selecting the horizontal scanning lines.

As shown in FIG. 1, the display driving circuit 3 is constructed by a shift register having a plurality of register stages SR for transferring a sampling pulse, and a plurality of sample-and-hold circuits S/H respectively driven by sampling pulses output from the respective output nodes of the register stages SR of the shift register. Each sample-and-hold circuit S/H is constructed by a first field effect transistor MS of n-channel type serving as an analog switch for sampling, a charge-holding capacitor CH for holding signal charges obtained by sampling input video signals Video R, Video G and Video B by means of the first field effect transistor MS, a second field effect transistor MC of n-channel type for compensating excess charges, and an output buffer BF. The basic construction is the same as the conventional construction. However, a sampling pulse different from a sampling pulse input to the gate of the first field effect transistor MS is applied to the gate of the second field effect transistor MC of each sample-and-hold circuit S/H, that is, a pulse obtained by inverting a sampling pulse from the transfer stage output node of the next or immediately succeeding register stage SR by use of an inverter INV is applied to the gate of the second field effect transistor MC in the case of FIG. 1.

Figure 4:
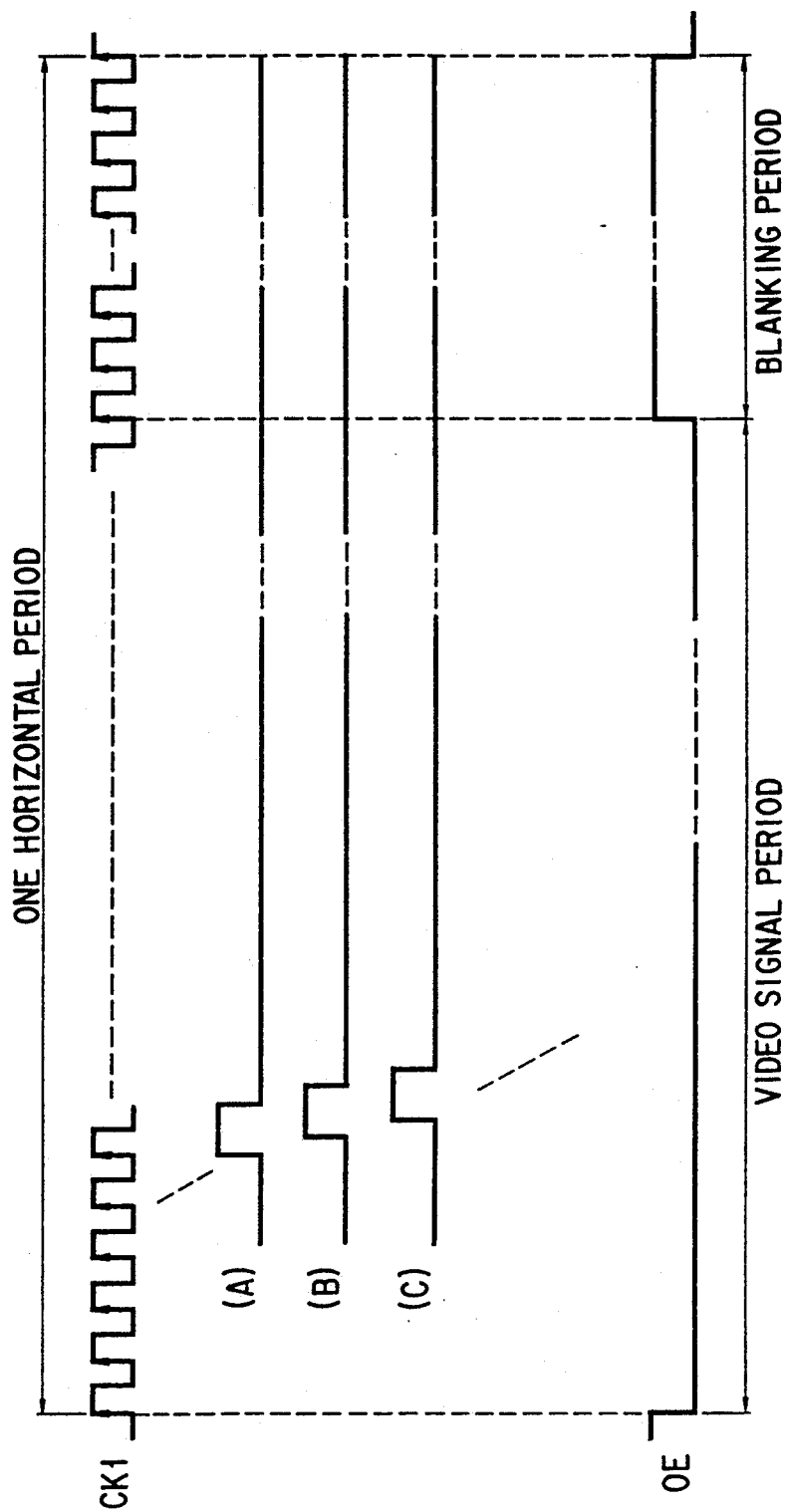
FIG. 4 is a waveform diagram for illustrating the operation of a sample-and-hold circuit in one horizontal period.
Figure 5:
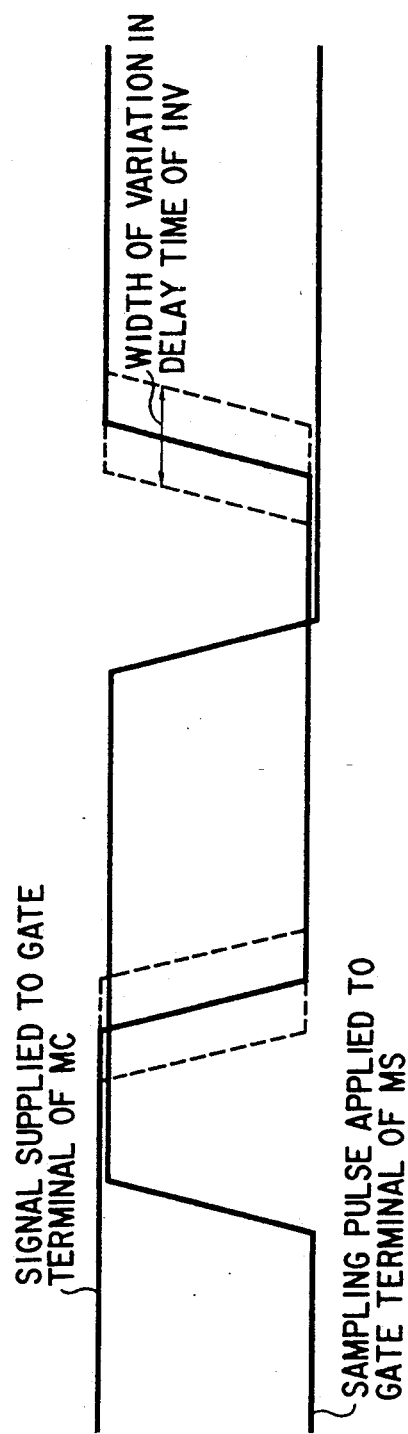
FIG. 5 is a diagram showing waveforms of driving signals for a field effect transistor of each sample-and-hold circuit.

The operation of the liquid crystal display driving circuit according to this embodiment is explained below with reference to FIGS. 3 to 5.

Figure 3:
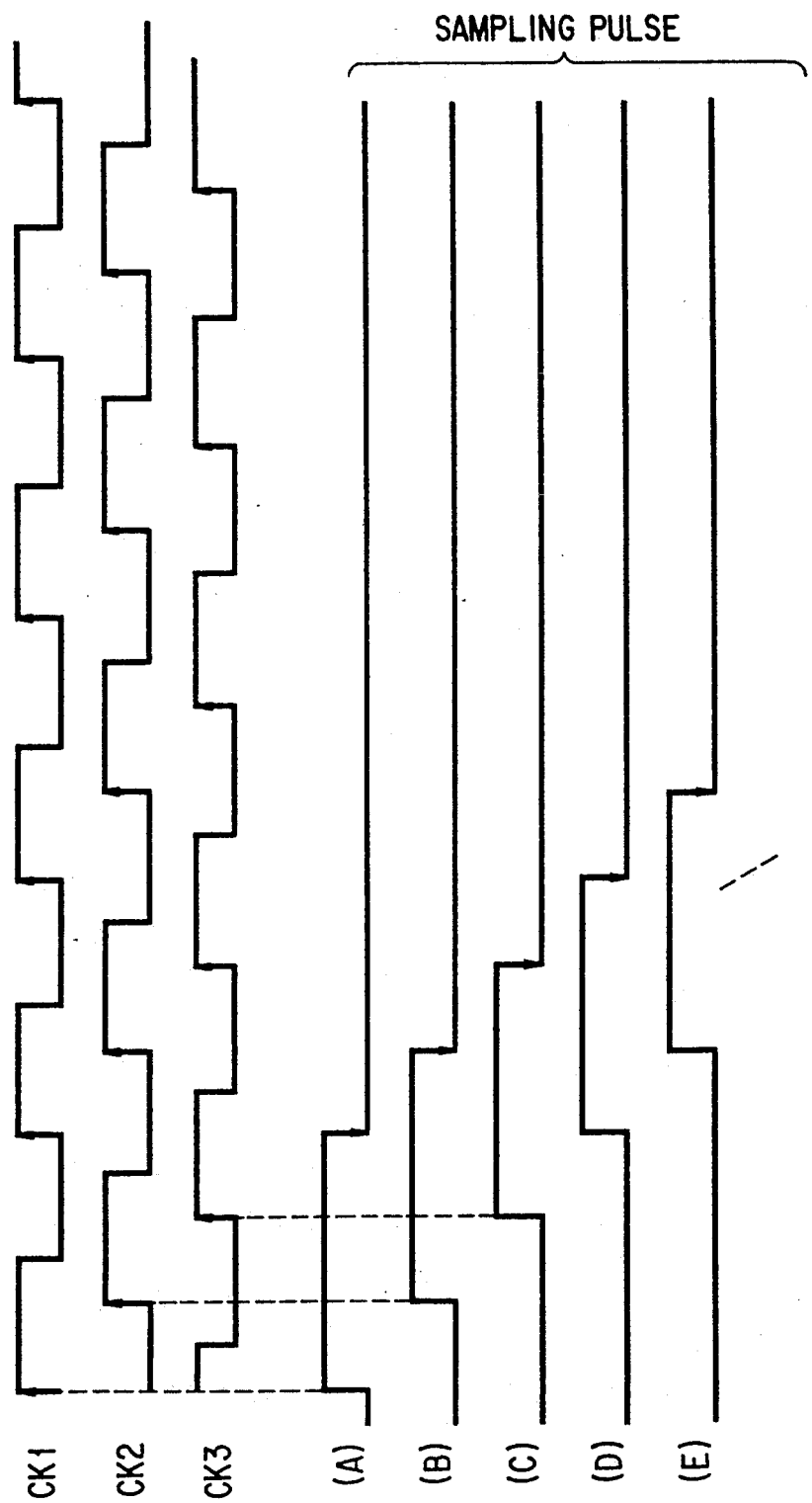
FIG. 3 is a waveform diagram for illustrating the operation of a shift register which is a sampling pulse transferring stage.

A sampling pulse is sequentially transferred into a plurality of register stages by a shift register driven by 3-phase clocks CK1 to CK3, and as shown in FIG. 3, sampling pulses with phase differences corresponding to the phase difference of the 3-phase clocks are derived from respective output nodes (A), (B), (C), . . . , of the register stages SR. The sampling pulses are applied to the sample-and-hold circuits S/H of respective stages. As shown in FIG. 4, video signals sampled in the video signal period of each horizontal period are sequentially held in the respective sample-and-hold circuits S/H. An output enable signal OE is set to a "H" level in the blanking period and signal voltages are simultaneously applied to a plurality of signal lines of the display unit via output buffers BF which are controlled by the output enable signal. At this time, video signals are updated in the liquid crystal cells 2 which lie on the scanning line selected by the scanning line selection circuit 4.

As described before, a sampling pulse is applied to the adjacent sample-and-hold circuit, that is, a sampling pulse output from the next or immediately succeeding register stage in response to the 3-phase clocks CK1 to CK3 is inverted by the inverter INV and applied as a driving pulse to the gate of the second field effect transistor MC for charge compensation of each sample-and-hold circuit S/H in the display driving circuit 3. At this time, the relation between the sampling pulse applied to the gate of the first field effect transistor MS of each sample-and-hold circuit S/H and the sampling pulse applied to the gate of the second field effect transistor MC is set as shown in FIG. 5. Broken lines in FIG. 5 indicate the range of variation in the delay time of the inverter INV. In this embodiment, since a delay time exactly corresponding to one clock period of the 3-phase clocks CK1 to CK3 occurs in a period between the trailing edge of the sampling pulse applied to the gate of the first field effect transistor MS and the rise of the sampling pulse applied to the gate of the second field effect transistor MC, the "H" level periods of the sampling pulses will not be overlapped on each other even if the delay time of the inverter INV has varied. That is, after the first field effect transistor MS is completely turned off the second field effect transistor MC is turned on.

Thus, the excess signal charge compensating operation by the second field effect transistor MC in the sample-and-hold circuit S/H of this embodiment can be always effected for stored charges of the holding capacitor CH and the effect thereof can be kept constant irrespective of the delay time of the inverter INV. Therefore, the output potential for the same input potential in each sample-and-hold circuit will not be changed, thus ensuring that the liquid crystal display apparatus driven by the output potential can provide image quality higher than that of the conventional liquid crystal display apparatus.

Figure 6:
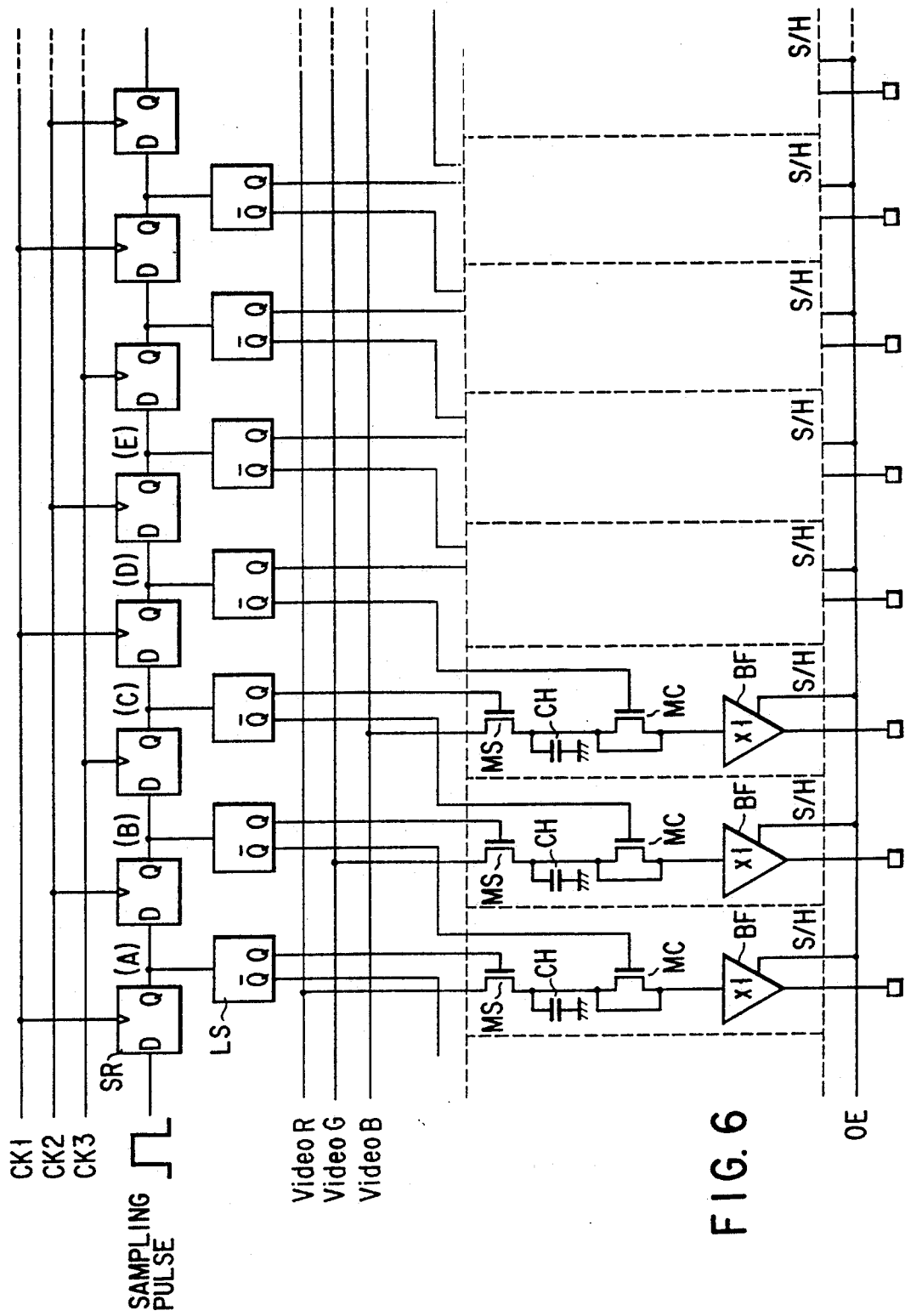
FIG. 6 shows another embodiment of this invention and is a circuit diagram of a driving circuit having a level shift circuit.

FIG. 6 shows another embodiment and portions which correspond to those of FIG. 1 are denoted by the same reference numerals and the detail explanation thereof is omitted. According to the embodiment of FIG. 6, a plurality of level shift circuits LS are connected to respective output stages of shift registers SR. The level shift circuits LS are used to convert sampling pulses of, for example, 5 V output from the output stages of the shift registers SR to sampling pulses of 20 V, for example. The level shift circuit LS has a non-inverted output terminal Q connected to the gate of the sampling field effect transistor MS and an inverted output terminal $\overline{Q}$ connected to the gate of the compensating field effect transistor of an immediately preceding-stage sampling circuit. Like the former embodiment, the circuit of this embodiment is operated according to the timing charts shown in FIGS. 3 and 4 and the same effect as that of the former embodiment can be obtained.

Figure 7:
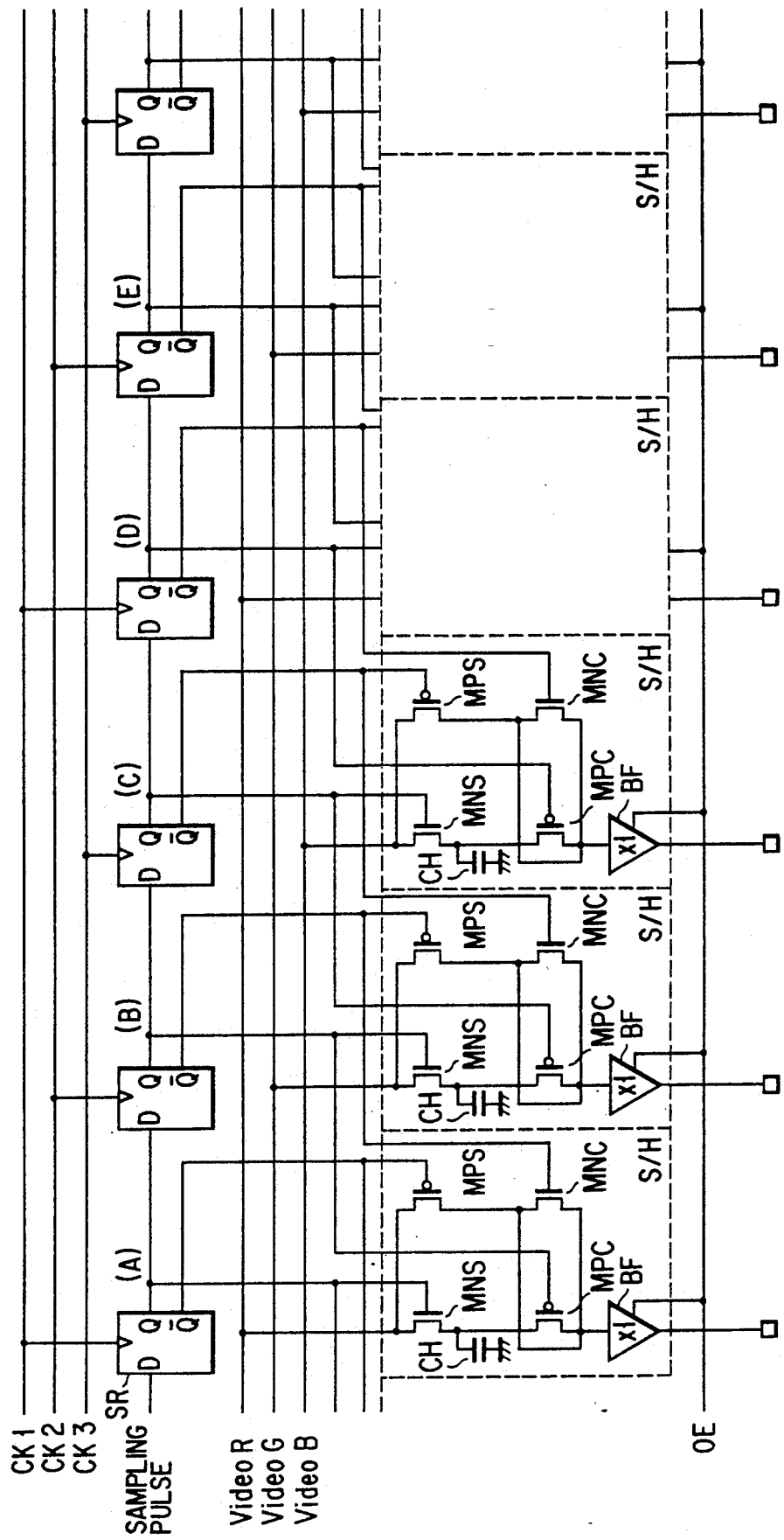
FIG. 7 is a circuit diagram of a liquid crystal display apparatus driving circuit according to another embodiment.

FIG. 7 shows a liquid crystal display driving circuit according to still another embodiment of this invention. Portions which correspond to those of FIG. 1 are denoted by the same reference numerals and the detail explanation thereof is omitted. In this embodiment, a first field effect transistor circuit constituting an analog switch of a sample-and-hold circuit S/H is constructed by a parallel circuit of a first n-channel field effect transistor MNS and a third p-channel field effect transistor MPS to widen a range of its operating voltage. The field effect transistors MNS and MPS are respectively driven by the Q and $\overline{Q}$ outputs of the shift register SR so as to be simultaneously turned on. Likewise, a second field effect transistor circuit for charge compensation is constructed by a parallel circuit of a second n-channel field effect transistor MNC and a fourth p-channel field effect transistor MPC. No inverter is used in the gate driving section for the charge compensating field effect transistors MNC and MPC, a Q output which is a sampling pulse of an adjacent transferring stage is applied to the gate of the p-channel field effect transistor MPC and a $\overline{Q}$ output is applied to the gate of the n-channel field effect transistor MNC. In this example, no inverter is used, but an operation equivalent to the operation of inverting the Q and $\overline{Q}$ outputs by use of inverters and turning on the n-channel field effect transistor MNC and p-channel field effect transistor MPC can be obtained.

The operation of the sample-and-hold circuit of this embodiment is the same as that of the former embodiment, and in this embodiment, a sample-and-hold circuit in which variation in the characteristic can be suppressed as in the former embodiment can be obtained.

In the above embodiments, a sampling pulse output from a register stage next to or immediately succeeding a register stage for outputting a sampling pulse applied to the first field effect transistor serving as the analog switch is used in order to drive the gate of the second field effect transistor for charge compensation, but it is possible to use a sampling pulse output from the other one of the succeeding register stages. In this case, if the sampling waveforms as shown in FIG. 3 are used, for example, the operation of inverting a sampling pulse of the node (B) of a register stage immediately succeeding a sampling pulse of the node (A) by use of an inverter and using the same as a driving pulse for the second field effect transistor is equivalent to the operation of inverting a sampling pulse of the node (C) of a second stage of the succeeding register stages by use of an inverter and using the same as a driving pulse for the second field effect transistor.

Figure 8:
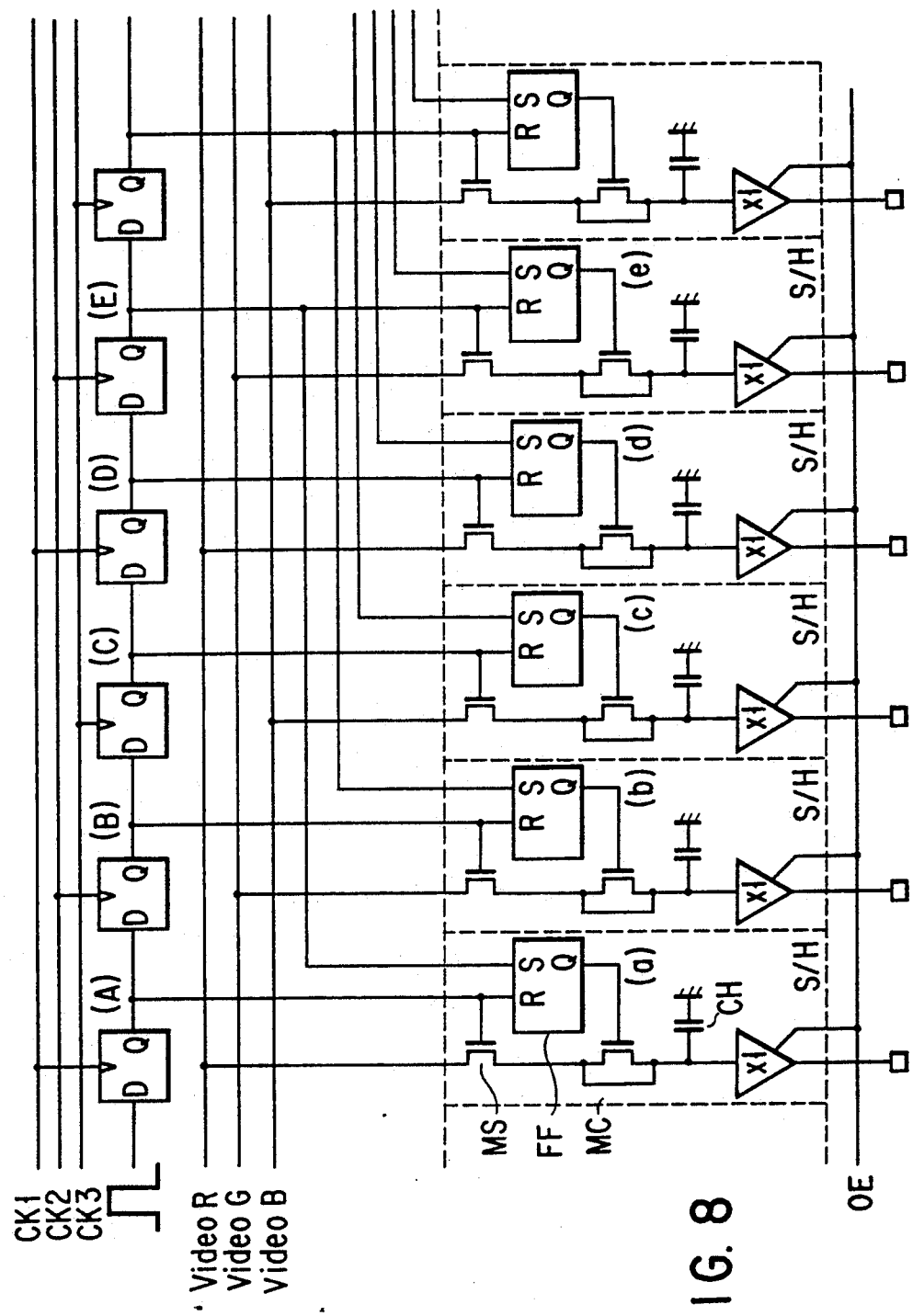
FIG. 8 is a circuit diagram of a liquid crystal display apparatus driving circuit according to still another embodiment.
Figure 9:
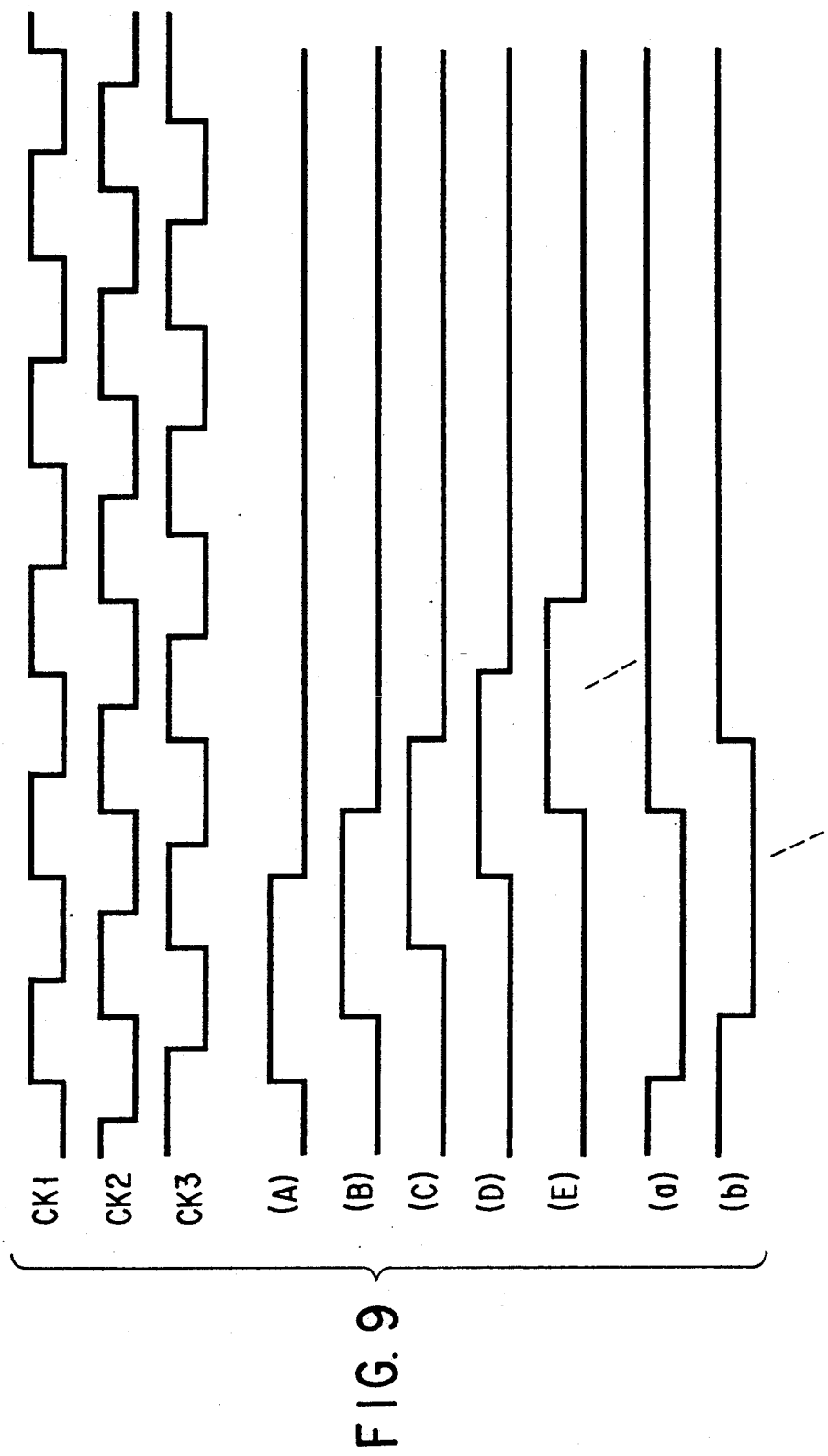
FIG. 9 is a timing diagram for illustrating the operation of the circuit of FIG. 8.

According to the embodiment of FIG. 8, each sample-and-hold circuit S/H further includes an RS flip-flop FF. The reset terminal R of the RS flip-flop circuit FF is connected to the first field effect transistor MS and the output terminal of a corresponding one of the register stages and the set terminal thereof is connected to the output node of a fourth stage of the succeeding register stages as viewed from the output node of the corresponding register stage. FIG. 9 shows the operation timing of the driving circuit of FIG. 8. As is understood from the timing chart, in this embodiment, the RS flip-flop FF is set by one of sampling pulses generated in response to 3-phase clocks CK1 to CK3 after one period from sampling pulses sequentially generated in response to the 3-phase clocks CK1 to CK3 and the Q output thereof is supplied to the second field effect transistor MC. Also, in this embodiment, it becomes possible to drive the first and second field effect transistors so as not to be set in the ON state at the same time.

In the above embodiments, the liquid crystal display apparatus is explained, but the sample-and-hold circuit used in the driving circuit for the display apparatus is not limited to the liquid crystal display driving circuit, but can be applied to an input circuit of analog memory, for example, and other applications.

As described above, according to this invention, it is possible to provide a sample-and-hold circuit in which a variation in the output characteristic is suppressed by delaying the driving timing of the charge compensating field effect transistor.

Further, according to this invention, a liquid crystal display apparatus capable of attaining high image quality can be provided by using a driving circuit constructed by use of the above sample-and-hold circuits.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A sample-and-hold circuit device comprising:
    sampling pulse transferring means for sequentially transferring a sampling pulse and sequentially outputting a plurality of sampling pulses from a plurality of output stages thereof; and
    a plurality of stages of sample-and-hold circuits for sampling and holding an input signal in response to the sampling pulses sequentially output from said plurality of output stages of said sampling pulse transferring means;
    wherein each of said plurality of stages of sample-and-hold circuits includes:
    a first field effect transistor for sampling the input signal in response to a corresponding one of the sampling pulses;
    a charge-holding capacitor for holding signal charges of the input signal sampled by said first field effect transistor;
    a second field effect transistor having a gate and a source and drain which are shorted and connected to said charge-holding capacitor to save excess charges accumulatively stored together with the signal charges in said charge-holding capacitors; and
    pulse applying means for applying a sampling pulse having a time delay corresponding to a time period required for transferring the sampling pulse by at least one stage of sample-and-hold circuit with respect to the sampling pulse applied to said first field effect transistor to the gate of said second field effect transistor.

2. A sample-and-hold circuit device according to claim 1, wherein said pulse applying means includes means for inverting a sampling pulse to be supplied to one of the succeeding-stage sample-and-hold circuits and applying the same to the gate of said second field effect transistor.

3. A sample-and-hold circuit device according to claim 1, wherein said pulse applying means includes an inverter for inverting a sampling pulse output from an output stage immediately succeeding the output stage of said transferring means for outputting the sampling pulse applied to said first field effect transistor and applying the inverted pulse to said second field effect transistor.

4. A sample-and-hold circuit device according to claim 1, which further comprises a plurality of stages of level shift circuit means respectively connected to the output stages of said transferring means, for raising the levels of the sampling pulses sequentially output from the output stages of said transferring means and each outputting a non-inverted output and an inverted output and in which said first field effect transistor samples the input signal in response to the non-inverted output of a corresponding one of said level shift circuit means and said pulse applying means applies the inverted output of the level shift circuit means, which is adjacent to the level shift circuit means for applying a non-inverted output thereof to said first field effect transistor, to said second field effect transistor.

5. A sample-and-hold circuit device according to claim 1, wherein each of said sample-and-hold circuits includes a third field effect transistor having a different channel type from said first field effect transistor, connected in parallel with said first field effect transistor and turned on at the same time as said first field effect transistor, and a fourth field effect transistor having a different channel type from said second field effect transistor, connected in parallel with said second field effect transistor and turned on at the same time as said second field effect transistor.

6. A sample-and-hold circuit device according to claim 1, wherein said pulse applying means includes an RS flip-flop FF having a reset terminal connected to a corresponding one of the output stages of said transferring means, a set terminal connected to a succeeding one of the output stages of said transferring means and an output terminal connected to the gate of said first field effect transistor.

7. A liquid crystal display apparatus comprising:
    a liquid crystal display having a plurality of picture elements, a plurality of signal lines for selectively supplying image signals to said picture elements and a plurality of scanning lines arranged to intersect said signal lines;
    a driving circuit including a plurality of sample-and-hold circuits arranged for said respective signal lines to sample and supply image signals to said signal lines and sampling pulse transferring means for sequentially applying sampling pulses to said sample-and-hold circuits, and
    a scanning line selection circuit for selectively driving said scanning lines;
    wherein each of said sample-and-hold circuits includes:
    a first field effect transistors for sampling the input signal in response to a corresponding one of the sampling pulses;
    a charge-holding capacitor for holding signal charges of the input signal sampled by said first field effect transistor;
    a second field effect transistor having a gate and a source and drain which are shorted and connected to said charge-holding circuit, for releasing excess charges accumulatively stored together with the signal charges in said charge-holding capacitor; and
    pulse applying means for applying a sampling pulse having a time delay corresponding to a time period required for transferring the sampling pulse by at least one stage of sample-and-hold circuit with respect to a sampling pulse applied to said first field effect transistor to the gate of said second field effect transistor.

8. A sample-and-hold circuit device according to claim 7, wherein said pulse applying means includes means for inverting a sampling pulse to be supplied to one of the succeeding-stage sample-and-hold circuits and applying the same to the gate of said second field effect transistor.

9. A sample-and-hold circuit device according to claim 7, wherein said pulse applying means includes an inverter for inverting a sampling pulse output from an output stage immediately succeeding the output stage of said transferring means for outputting the sampling pulse applied to said first field effect transistor and applying the inverted pulse to said second field effect transistor.

10. A sample-and-hold circuit device according to claim 7, which further comprises a plurality of stages of level shift circuit means respectively connected to the output stages of said transferring means, for raising the levels of the sampling pulses sequentially output from the output stages of said transferring means and each outputting a non-inverted output and an inverted output and in which said first field effect transistor samples the input signal in response to the non-inverted output of a corresponding one of said level shift circuit means and said pulse applying means applies an inverted output of a level shift circuit means, which is adjacent to the level shift circuit means for applying a non-inverted output thereof to said first field effect transistor, to said second field effect transistor.

11. A sample-and-hold circuit device according to claim 7, wherein each of said sample-and-hold circuits includes a third field effect transistor having a different channel type from said first field effect transistor, connected in parallel with said first field effect transistor and turned on at the same time as said first field effect transistor, and a fourth field effect transistor having a different channel type from said second field effect transistor, connected in parallel with said second field effect transistor and turned on at the same time as said second field effect transistor.

12. A sample-and-hold circuit device according to claim 7, wherein said pulse applying means includes an RS flip-flop FF having a reset terminal connected to a corresponding one of the output stages of said transferring means, a set terminal connected to a succeeding one of the output stages of said transferring means and an output terminal connected to the gate of said first field effect transistor.

* * * * *